United States Patent [19]
Jubin et al.

[11] Patent Number: 6,078,875
[45] Date of Patent: Jun. 20, 2000

[54] AUTOMATED AUDITING SYSTEM

[75] Inventors: Bradford Tyler Jubin, Peachtree City; Michael Albert Sanchez, Fayetteville; Albert C. Breidegam, Sharpsburg; Edwin B. Bradley, Moreland, all of Ga.

[73] Assignee: Semtronics Corporation, Peachtree City, Ga.

[21] Appl. No.: 08/915,280

[22] Filed: Aug. 20, 1997

[51] Int. Cl.$^7$ ..................................... G08B 21/00
[52] U.S. Cl. .......................... 702/123; 702/108; 702/119; 340/649; 324/500; 361/212
[58] Field of Search .............. 702/123, 82, 108, 702/119; 340/649; 324/500; 361/212

[56] References Cited

U.S. PATENT DOCUMENTS

| | | | |
|---|---|---|---|
| 4,638,399 | 1/1987 | Maroney et al. | 361/220 |
| 4,639,825 | 1/1987 | Breidegam | 361/212 |
| 4,710,751 | 12/1987 | Webster. | |
| 4,724,520 | 2/1988 | Athanas et al.. | |
| 4,745,519 | 5/1988 | Breidegam | 361/220 |
| 4,785,294 | 11/1988 | Campbell. | |
| 4,800,374 | 1/1989 | Jacobson. | |
| 4,813,459 | 3/1989 | Breidegam. | |
| 4,859,992 | 8/1989 | Hoigaard. | |
| 4,961,157 | 10/1990 | Nick et al. | 702/82 |
| 4,974,115 | 11/1990 | Breidegam et al. | 361/231 |
| 5,083,117 | 1/1992 | Hoigaard | 340/649 |
| 5,422,630 | 6/1995 | Quinn et al.. | |
| 5,519,384 | 5/1996 | Chanudet et al.. | |
| 5,588,119 | 12/1996 | Vincent et al.. | |
| 5,661,657 | 8/1997 | Jordan et al. | 702/108 |
| 5,675,813 | 10/1997 | Holmdahl. | |

FOREIGN PATENT DOCUMENTS

| | | |
|---|---|---|
| 0 590 180 A1 | 9/1992 | European Pat. Off.. |
| 4235379 | 4/1994 | Germany. |
| 7275371 | 10/1995 | Japan. |
| WO99/04277 | 1/1999 | WIPO. |

OTHER PUBLICATIONS

ESD Association Advisory for Electrostatic Discharge Terminology–Glossary.

Primary Examiner—John Barlow
Assistant Examiner—Hien Vo
Attorney, Agent, or Firm—James L. Ewing, IV; Michael F. Labbee; Kilpatrick Stockton, LLP

[57] ABSTRACT

The present invention provides automated systems for performing electrostatic discharge (ESD) device efficacy verification and recording the results for an ESD auditing program. Systems of the present invention comprise at least one ESD device testing unit. The testing unit may include sensors and circuits for identifying particular worker who are performing the test. The testing unit includes a testing circuitry for periodic verification of the efficacy of the ESD device. A communication system allows the testing unit to communicate with a central computer which collects, stores and allows the manipulation of the test data. Systems of the present invention are therefore useful in testing the ESD devices, documenting their performance, and controlling access to particular work areas based on testing results.

19 Claims, 26 Drawing Sheets

FUNCTION 129 "WRIST STRAP AND FOOTWEAR"

FIG. 12

SMART LOG (ADVANCED OPTIONS)

ID START POSITION    TIME AND DATE        ID LENGTH    RELAY ON TIME (SECONDS)
    1                6:20:59 PM 7/7/97        8                    5

| UNIT | ID START | ID LENGTH | RELAY TIME |
|---|---|---|---|
| COM 1 UNIT 00 | 1 | 8 | 5 |

PROGRAM SELECTED

PROGRAM ALL

GLOBAL

FIG. 13

SMART LOG (OPTIONS)

ID START POSITION    TIME AND DATE    ID LENGTH    RELAY ON TIME (SECONDS)

| 1 |    | 6:19:00 PM  7/7/97 |    | 8 |    | 5 |

ADVANCED

PROGRAM ALL

DONE

FIG. 14

SMARTLOG (SELECT POLLING RATE)

☒ AUTOPOLLING ENABLED

SMARTLOG POLLING RATE
5 MINUTES

HOURS    MINUTES

☐ DISABLE AUTOPOLLING WHEN PROGRAM IS MINIMIZED

CLOSE

FIG. 16

SMARTLOG [EDIT EMPLOYEE DATABASE]

FILE  SORT  FIND  ADD  DOWNLOAD

| EMPLOYEE ID | LAST NAME | FIRST NAME | NOTES | TEST REQUIRED |
|---|---|---|---|---|
| 10100001 | KIRKLAND | PETER | VP OF SALES | WRIST STRAP OR FOOTWEAR |
| 10100002 | GORDON | RYAN | DIR. OF MARKETING | <DEFAULT> |
| 10100003 | SANCHEZ | VICTORIA | PRESIDENT | NO TEST REQUIRED |
| 10100004 | KIRKLAND | CHRISTOPHER | CHIEF SCIENTIST | FOOTWEAR ONLY |

EXIT

FIG. 17

SMARTLOG [IMPORT EMPLOYEES]

IMPORT FROM:

03 OPTION.FRM
13 IMPORT.FRM
13 IMPORT.FRX
20 OPEN.FRM
20 OPEN.FRX
20 SAVE.FRM
61 .SHC

DIRECTORIES:

C:\Vb

C:\
Vb
ARCHIVE
BITMAPS
hC
ICONS

IMPORT TYPE:

REPLACE
APPEND
UPDATE
REPLACE

"REPLACE" REMOVES EXISTING EMPLOYEES AND ADDS THE NEW ONES

FILE DELIMITER:

TAB

DRIVER

C:

IMPORT

EXIT

THE TEXT FILE FORMAT MUST BE AS FOLLOWS, WITH EACH EMPLOYEE ON A SEPARATE LINE.

LAST NAME (DELIMITER) FIRST NAME (DELIMITER) EMPLOYEE ID (DELIMITER) NOTES (DELIMITER) TEST REQUIRED

SMARTLOG [SAVE EMPLOYEE DATABASE]

THE EMPLOYEE DATABASE WILL BE
SAVED IN MICROSOFT ACCESS FORMAT

DIRECTORIES:
c:\vb

- c:\
- vb
  - archive
  - bitmaps
  - hc
  - icons

SAVE AS:
*.mdb

- empl.mdb
- empty.mdb
- iiiiii. mdb
- iiiiiii.mdb
- ki. mdb
- killer.mdb
- one_empl.mdb
- pp.mdb
- ppp.mdb
- qqqq.mdb
- sccndata.mdb
- sccntut.mdb DRIVES:
c:

SAVE
EXIT

FIG. 20

SMARTLOG [DOWNLOAD EMPLOYEE]

☒ SEARCH BEFORE DOWNLOAD

SELECT SMARTLOG
SMARTLOG # 00
ON COM 2

DOWNLOAD TO SELECTED

DOWNLOAD TO ALL

DONE

FIG. 22

SMARTLOG [NEW DATA RETRIEVAL]

"VIEW" ALLOWS YOU TO VIEW THE DATA, BUT DOESN'T STORE IT OR CLEAR THE SMARTLOGS

☒ SEARCH BEFORE VIEW

VIEW SELECTED

VIEW ALL

DONE

SELECT SMARTLOG

FIG. 23

SMARTLOG [ARCHIVE DATABASE]

THE NAME OF THE FILE TO ARCHIVE TO

ARCHIVE TO:

1.MDB

DUMP. MDB
EMPLOYEE. MDB
SMARTLOG. MDB
TEMPSLOG. MDB

DIRECTORIES:
C:\SMARTLOG

C:\
SMARTLOG
DATA
INSTALL
V1 DOS
V2 DOS

ARCHIVING CLEARS THE
CURRENT DATABASE

ARCHIVE

DONE

FILE TYPE:
ACCESS

DRIVES:
C:

FIG. 24

THE NAME OF THE FILE TO COPY TO

COPY TO:
I.MDB

DUMP. MDB
EMPLOYEE. MDB
SMARTLOG. MDB
TEMPSLOG. MDB

DIRECTORIES:

C:\
SMARTLOG
DATA
INSTALL
V1 DOS
V2 DOS

COPYING DOES NOT AFFECT
THE CURRENT DATABASE

COPY

DONE

FILE TYPE
ACCESS

DRIVES:
C:

SMARTLOG [VIEW DATA]

SORT  FIND  UPDATE

| EMPLOYEE ID | STATUS | DATE | TIME | SMARTLOG UNIT | LAST NAME | FIRST NAME | NOTES |
|---|---|---|---|---|---|---|---|
| 10100003 | NO TEST REQ. | 6/19/97 | 01:17PM | COM2 UNIT 00 | SANCHEZ | VICTORIA | PRESIDENT |
| 10100002 | WRIST STRAP PASS | 6/19/97 | 03:11PM | COM2 UNIT 00 | GORDON | RYAN | DIR. OF MARKETING |
| 10100004 | FOOTWEAR PASS | 6/19/97 | 03:17PM | COM2 UNIT 00 | KIRKLAND | CHRIS | CHIEF SCIENTIST |
| 10100003 | WRIST STRAP PASS | 6/20/97 | 09:18AM | COM2 UNIT 00 | SANCHEZ | VICTORIA | PRESIDENT |
| 10100001 | WRIST STRAP FAIL HIGH | 6/20/97 | 11:33 AM | COM2 UNIT 00 | KIRKLAND | PETER | VP OF SALES |
| 10100001 | FOOTWEAR PASS | 6/20/97 | 01:30PM | COM2 UNIT 00 | KIRKLAND | PETER | VP OF SALES |
| 10100002 | WRIST STRAP PASS | 6/20/97 | 03:12PM | COM2 UNIT 00 | GORDON | RYAN | DIR. OF MARKETING |
| 10100004 | FOOTWEAR PASS | 6/20/97 | 03:19PM | COM2 UNIT 00 | KIRKLAND | CHRIS | CHIEF SCIENTIST |
| 10100001 | UNKNOW STATUS | 6/21/97 | 09:18AM | COM2 UNIT 00 | KIRKLAND | PETER | VP OF SALES |

DONE

FIG. 25

AUTOMATED AUDITING SYSTEM

BACKGROUND OF THE INVENTION

Static electricity creates problems in the electronics and other industries, particularly with the advent of integrated circuits and other microelectronic components. Components such as integrated circuits, for instance, may be disabled or destroyed by over-voltages or power density resulting from static electricity. Certain junctions in such circuits can be destroyed by as little as a 50 volt potential, which radically changes the doping structure in their lattices. Power densities resulting from excessive potential and imperfections in circuit layout or structure can vaporize or radically alter the silicon substrate and thus impair or destroy a circuit's performance. Yet a person walking on carpet on a dry day can accumulate as much as 30,000 volts of potential, and he or she can triboelectrically generate thousands of volts by simply changing his or her position in a chair or handling a styrofoam cup.

Such a person can inadvertently discharge such static potential into a circuit or component by touching it and causing over-voltage or excessive power density. Additionally, the potential in such a person's body can induce a charge in a circuit that can later cause over-voltage or excessive power density when the circuit is subsequently grounded.

Those in industries in which integrated circuits and other microelectronic components are handled or assembled may take measures to limit the failure rate of those circuits and components by attempting to keep them as well as their environment at zero electrical potential. Such measures include providing workers and work stations with electrostatic discharge (ESD) devices, such as antistatic carpet, conductive or dissipative grounded desk top work surfaces, hot air ion generators which emit ions to neutralize static changes, grounding wrist straps, heel grounders and other garments to keep workers at zero potential.

The situations in which grounding wrist straps are used heighten the importance of their being effective, reliable, and predictable. The person working on microelectric components or integrated circuits may be completely unaware that he or she has accumulated minor static electrical charges, and may therefore unknowingly be in a position to disable circuits on which he or she is working or which he or she is handling. If the strap is loose or has been removed or if it is not functioning properly for other reasons, the worker may be unaware that electrical discharges transmitted from his or her fingers are disabling the circuits. (A typical person cannot sense a static electrical discharge of less than approximately 3,500 volts.) No one may discover that the circuits have been disabled or damaged until hours, days or weeks later, when the circuits have been placed in components or devices which fail in the field. Removal and repair or replacement of these circuits once in the field is far costlier than avoiding potential failure while the worker is handling the circuits.

Various procedures for ensuring the proper use and efficacy of ESD devices have been developed. For instance, wrist strap or heel grounder testers have been developed which allow a worker to verify the efficacy of the device. These testing units may be used periodically to monitor the efficacy of the ESD device. In other words, each work area may have an ESD device testing unit with which each worker verifies his or her ESD device(s) prior to beginning a shift or at other predetermined intervals.

Such testing units are of little value, however, if they are not used in a manner which creates confidence that the ESD devices are being tested frequently and consistently enough to ensure reliable function. Thus, protocols may be established for periodic testing or auditing of the ESD devices. For instance, ISO 9000 standards require that any claims that products are manufactured under ESD controlled conditions be verifiable through documentation. Thus, workers must record their use of the devices and periodically verify their efficacy with test equipment. These records are then used to certify the products under the standard. Other industry standards or internal operating procedures also may require documentation of ESD auditing programs.

One problem created by conventional methods for recording and tracking of ESD auditing programs is the generation of large amounts of printed documents or records. Such documentation is, however, required for many manufacturing processes. These records can be bulky and so voluminous that they are practically useless for analytical purposes. Thus, in order to provide the data that can be used in meaningful ways, the records must be entered by hand into a computer database—an expensive and time consuming process. Furthermore, maintaining such records by hand can introduce errors resulting from mis-recording or worker inattention.

Moreover, the conventional method of recording ESD data, i.e., by hand, typically fails to record data which may be particularly useful in establishing, monitoring and improving an ESD auditing program and the ESD devices themselves. For instance, if the test of a wrist strap or other ESD device fails, the worker typically adjusts the device and re-tests, repeating the process until a satisfactory test result is achieved. The user then records the fact that the test was performed and passed and proceeds to a work station. The records do not reflect, however, the fact that several tries may have been necessary in order to pass the test. This information is valuable because it can give statistical information as to the reliability and durability of the ESD device.

Another limitation of manual data entry is the lack of real-time availability of the data to the program supervisor. Currently, if a supervisor wishes to determine whether all ESD devices have been properly tested according to program requirements, he or she must go to each testing station and examine the log book. In a large fabrication facility, the examination of each log book may be difficult or even impossible to do in a short time.

SUMMARY OF INVENTION

The present invention provides an automated system for performing ESD device tests and recording the results for an ESD auditing program. Systems according to the present invention comprise at least one ESD device testing unit. The testing unit may provide functionality for identifying the worker who is performing the test and includes testing circuitry for on-demand verification of the efficacy of the ESD device. A communication system allows the testing unit to communicate with a central computer or processor which collects, stores and allows the manipulation of the test data.

To perform on-demand verification, a worker connects his or her ESD device to the testing unit. An identification device, such as a card bearing a bar code, magnetic stripe or other information storage medium, is read by the test unit. The identity of the worker is verified from an employee database and the appropriate test procedure for that worker is determined. The test unit then assesses the efficacy of the ESD device or devices. If the device is functioning properly, that fact is recorded by the unit and the worker may disconnect from the testing unit and proceed to his or her work assignment. The test unit may operate a switch which controls access to the work area via an electronic door, turnstile, or it may otherwise control access to or activation of the worksite.

If the device is not functioning properly, the unit records that fact and indicates it to the worker. The worker then performs appropriate corrective action, such as tightening the strap, applying conductive lotion or replacing the wrist strap, or other action as may be required in the particular workplace or applicable standards or procedures. The worker then repeats the testing process. The test unit stores the test results, including all failed attempts. A central computer periodically polls the test units and downloads the test data stored therein. These data are compiled in the desired format to comply with documentation standards. Furthermore, statistical analysis may be performed to generate other desired data.

The automated auditing system of present invention presents several advantages over the conventional method of performing and documenting the testing of ESD devices. The automated system eliminates the bulky and voluminous logs associated with a manual recordation system. Furthermore, because the data is recorded on a central device, the likelihood of lost logs and the need for a separate log at each testing station is eliminated. The speed at which tests are performed and recorded is also reduced. A worker need only perform the test and the test data is automatically recorded, allowing the worker to proceed to his or her work assignment without undue delay. These factors combine to increase worker productivity and reduce production costs, particularly documentation costs.

The automated system can record all data required by documentation standards, such as ISO 9000. Reports required by such standards may be produced automatically without the need for incorporating bulky log books into the documentation or manually inputting data from log books into an electronic format. Thus, documentation processing requirements are dramatically reduced. The automated system also reduces or eliminates worker errors, both in testing and recording of test results. Furthermore, by identifying automatically each worker performing the test, the system increases worker accountability. Moreover, a supervisor may instantly confirm that all testing has been performed at any given time without having to go to each testing station and review a paper log.

In addition to simplifying data acquisition and processing, the automated system creates the ability to collect and analyze more sophisticated and valuable information. Because the system may record every time that a test is performed and its result (rather than the mere recordation of a successful test) and therefore the number of failed tests, a supervisor or designer of ESD devices may analyze the test results to determine the status of the ESD devices over time. This allows analysis of the reliability and durability of the devices and improvement of the designs thereof.

Accordingly, it is an object of the present invention to provide automated systems for testing, verifying, documenting, and reporting the status and efficacy of ESD devices, allowing analysis and manipulation of the data acquired thereby and providing access control which eliminates the need for manual recordation of test results.

It is a further object of the present invention to provide automated systems for testing, verifying, documenting, and reporting the status and efficacy of ESD devices, allowing analysis and manipulation of the data acquired thereby and providing access control which eliminates the need for voluminous hard-copy records while providing the reports required under applicable manufacturing standards.

It is a further object of the present invention to provide automated systems for testing, verifying, documenting, and reporting the status and efficacy of ESD devices, allowing analysis and manipulation of the data acquired thereby and providing access control which allows complete information regarding testing procedures to be recorded.

It is a further object of the present invention to provide automated systems for testing, verifying, documenting, and reporting the status and efficacy of ESD devices, allowing analysis and manipulation of the data acquired thereby and providing access control which allows the accumulated data to be manipulated and analyzed in a meaningful way.

It is a further object of the present invention to provide automated systems for testing, verifying, documenting, and reporting the status and efficacy of ESD devices, allowing analysis and manipulation of the data acquired thereby and providing access control which allows instant access to ESD auditing program records at a central location.

It is a further object of the present invention to provide automated systems for testing, verifying, documenting, and reporting the status and efficacy of ESD devices, allowing analysis and manipulation of the data acquired thereby and providing access control which collects and formats test result data in a predetermined manner.

It is a further object of the present invention to provide automated systems for testing, verifying, documenting, and reporting the status and efficacy of ESD devices, allowing analysis and manipulation of the data acquired thereby and providing access control which reduce the time associated with performing and recording the results of test procedures.

It is a further object of the present invention to provide automated systems for testing, verifying, documenting, and reporting the status and efficacy of ESD devices, allowing analysis and manipulation of the data acquired thereby and providing access control which automatically identify the worker being tested.

It is a further object of the present invention to provide automated systems for testing, verifying, documenting, and reporting the status and efficacy of ESD devices, allowing analysis and manipulation of the data acquired thereby and providing access control which allows instant access to all test records from a central location.

It is a further object of the present invention to provide automated systems for testing, verifying, documenting, and reporting the status and efficacy of ESD devices, allowing analysis and manipulation of the data acquired thereby and providing access control which records all test results, including failures, to allow more sophisticated analysis of ESD device performance and reliability.

Other objects, features and advantages of the present invention will become apparent with reference to the remainder of this document.

BRIEF DESCRIPTION OF THE DRAWINGS

FIG. 12 shows a user interface screen for setting the configuration of a monitoring system in accordance with the present invention.

FIG. 13 shows an alternate user interface screen for setting the configuration of a monitoring system in accordance with the present invention.

FIG. 14 shows a user interface screen for setting the polling rate of a monitoring system in accordance with the present invention.

FIG. 16 shows a user interface screen for inputting and editing employee data in an employee database in accordance with the present invention.

FIG. 17 shows a user interface screen for inputting an employee database into a monitoring system in accordance with the present invention.

Figure 18:
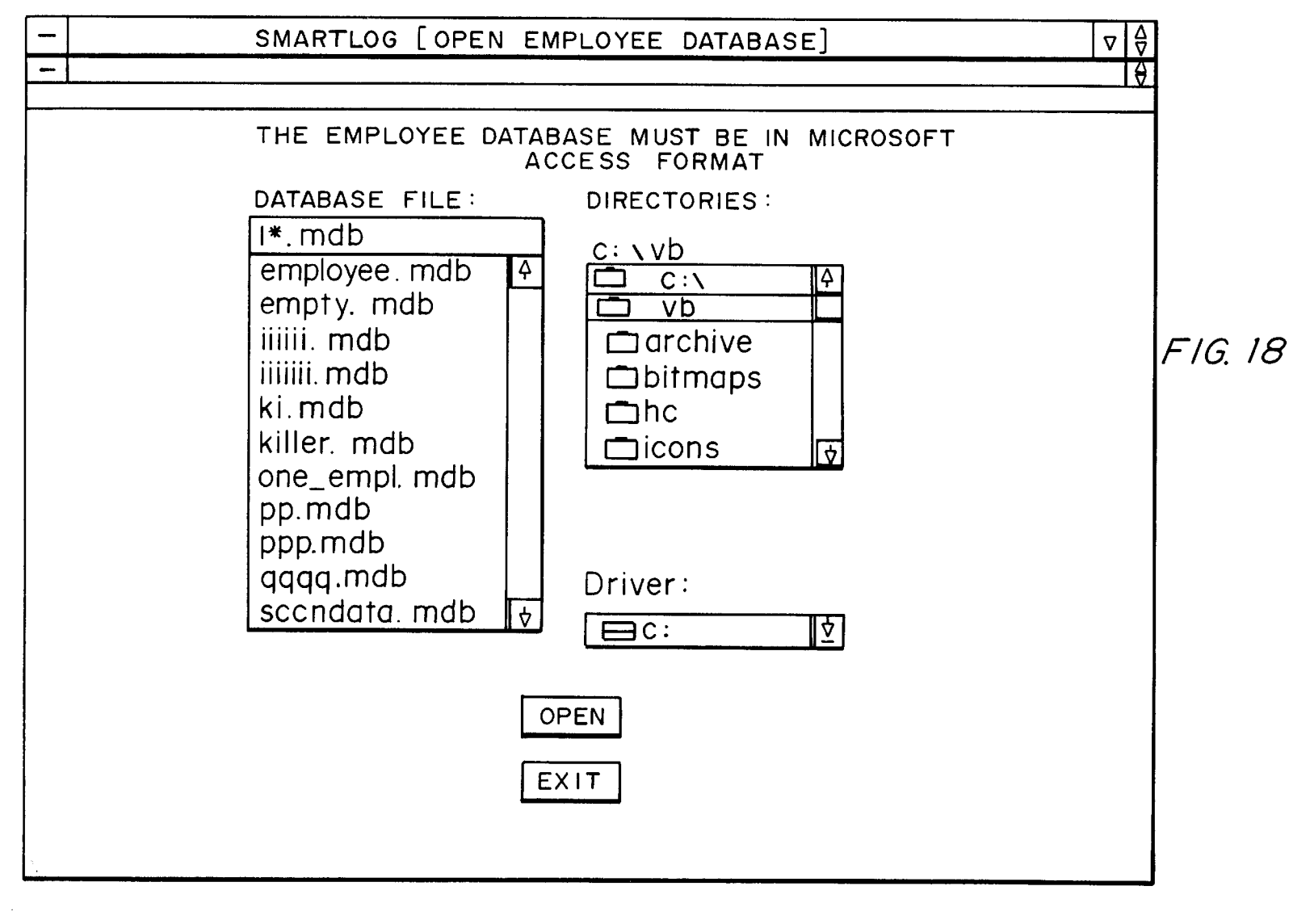

FIG. 18 shows a user interface screen for opening an employee database into a monitoring system in accordance with the present invention.

FIG. 19 shows a user interface screen for saving an employee database into a monitoring system in accordance with the present invention.

FIG. 20 shows a user interface screen for downloading data to a test unit with a monitoring system in accordance with the present invention.

FIG. 22 shows a user interface screen for viewing data from a test unit with a monitoring system in accordance with the present invention.

FIG. 23 shows a user interface screen for archiving data from a monitoring system in accordance with the present invention.

FIG. 24 shows a user interface screen for copying data from a monitoring system in accordance with the present invention.

FIG. 25 shows a user interface screen for displaying test data acquired by a monitoring system in accordance with the present invention.

DETAILED DESCRIPTION

Figure 1:
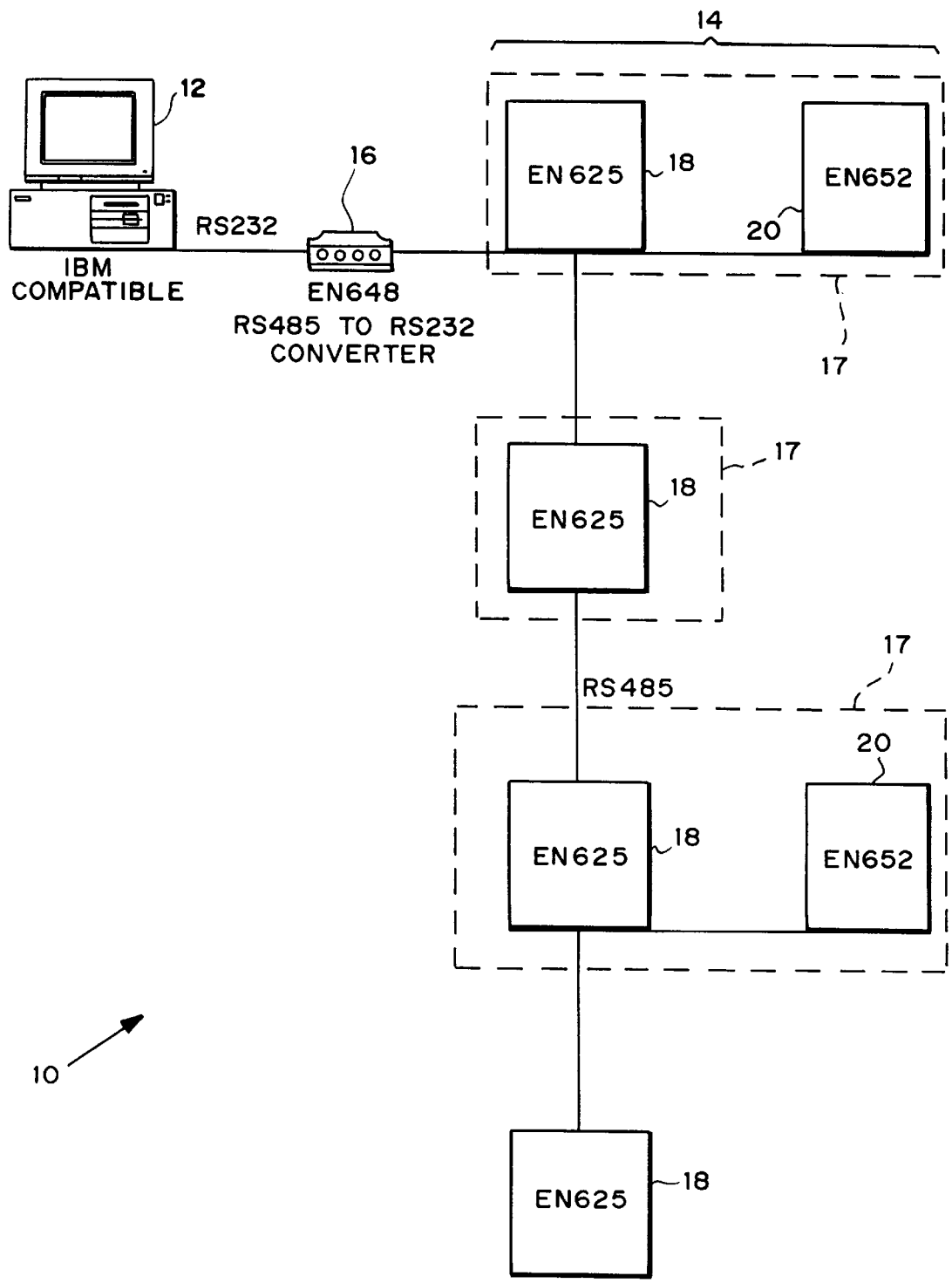
FIG. 1 is a functional block diagram which represents the topology of a first embodiment of an automated auditing system according to the present invention.

FIGS. 1–24 show an illustrative embodiment of automated auditing systems 10 for on-demand or periodic testing of ESD devices in accordance with the present invention. System 10 generally comprises central computer 12 and testing system 14. Communication module 16 may be provided if communications protocols between computer 12 and system 14 are dissimilar. For example, in the illustrated embodiment, system 14 transmits and receives data via the RS485 protocol while computer 12 transmits and receives data via the RS232 protocol. Thus, module 16 converts the data transmissions as appropriate. In the illustrated embodiment, module 16 is an off-the-shelf RS485 to RS232 converter, such as those available from Coastal Data Products, Inc., 6135 N.W. 167th Street, Hialeah, Fla. 33015.

Computer 12 may be any conventional computer, such as a personal computer. For instance, computer 12 may be an IBM® compatible personal computer with the following specifications:

DOS 5.0 or higher

286 Processor or higher 512k Minimum RAM

At least one Serial Communication Port

Hard Drive with minimum of 2 MB available

Alternatively, any Windows®-based or other computer may be used.

Computer 12 receives test data from system 14 as data strings in ASCII format or other appropriate character set. The data may then be transferred into a conventional spreadsheet or database application for manipulation and processing. Alternatively, a custom database application may be provided which automatically formats the data in the desired or required manner.

Figure 2:
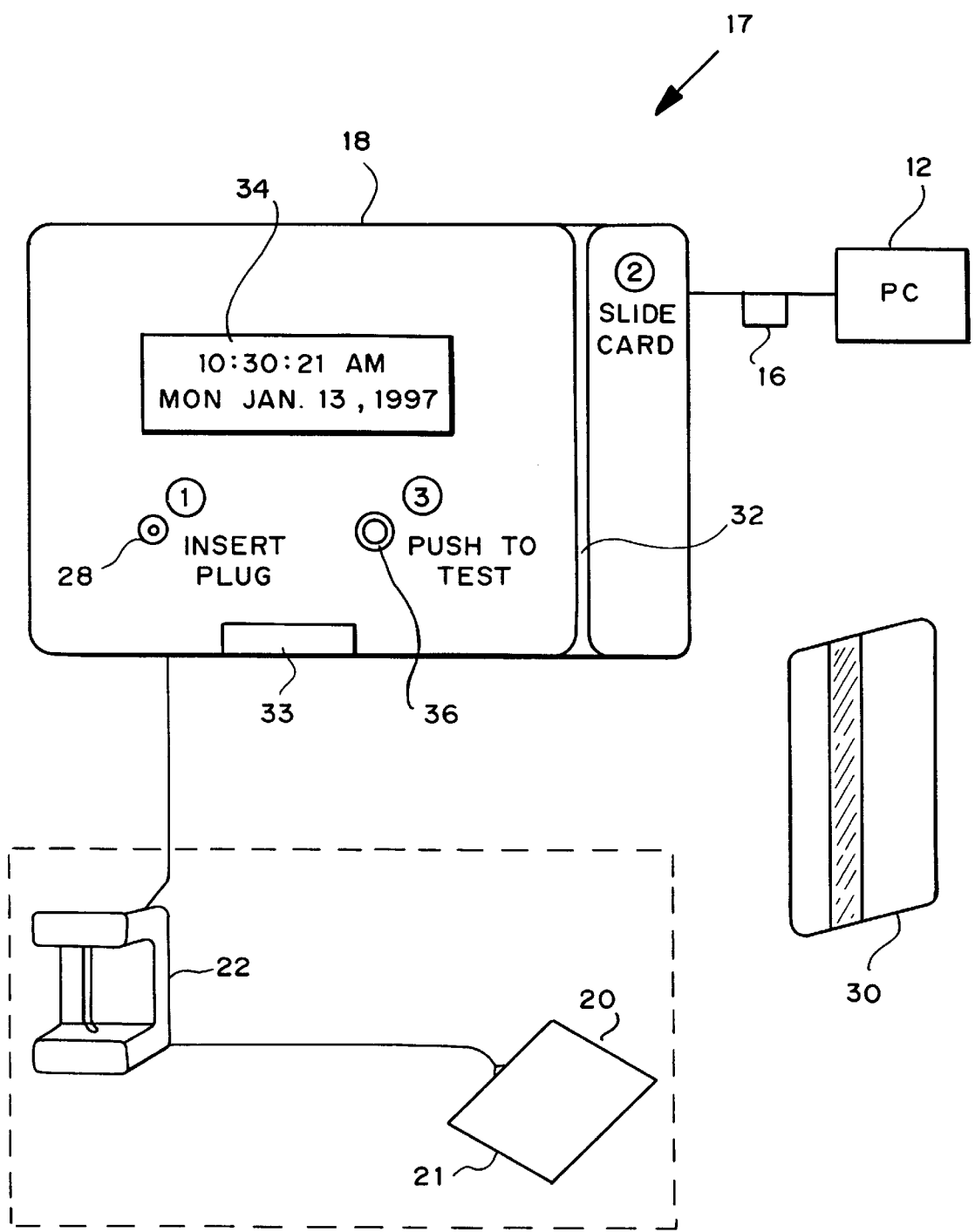
FIG. 2 illustrates one form of a test station of the system of FIG. 1.

System 14 includes a number of test stations 17, each in turn including an automated test unit 18 and, if desired, optional tester 20. FIG. 2 shows a test station 17 including test unit 18 and optional tester 20 connected thereto. In the illustrative embodiment, optional tester 20 is a footwear tester which comprises grounded foot-plate 21 and handgrip 22. Other forms of footwear testers may also be used.

Automated test unit 18 comprises a conventional electronic time clock, such as the SmartClock®, available from Coastal Data Products, Inc., 6135 N.W. 167th Street, Hialeah, Fla. 33015, modified to include ESD testing and logic circuits. A conventional time clock typically includes a clock, a memory for storing employee information and may have a relay which may control some form of access system. For example, such a time clock may be used to clock in employees and allow or deny access to a work area via an electronic door or turnstile.

A conventional time clock (or if desired, a custom time clock) is modified to create automated test unit 18 by including programming which allows each unit to store or otherwise have access to the specific testing requirements for each worker, or one or more relevant workers, associated with the resident database of all workers. In other words, different workers may have different testing protocols which they must satisfy. For instance, a supervisor who does not touch production materials may not be required to wear an ESD device and therefore may be allowed to enter work areas without conducting an ESD test. Similarly, cleaning staff may be required to wear ESD footwear, but need not wear a wrist strap. Thus, the database allows the appropriate test to be prompted for each worker as appropriate. Programming of the database, i.e., entry of worker name, identification number and test requirements, and other relevant data may be performed via computer 12. When tests are performed, the time clock stores and "time stamps" the results. When the test results are processed, the date and time of each test can then be identified as necessary for record keeping requirements. Alternatively, a simpler clock may be used which merely "stamps" each test result with the amount of time that has elapsed since the occurrence of some predetermined event, such as the last time data was downloaded from the test unit. The date and time of each test may then be calculated from the elapse time data and the date and time of the predetermined event. Such a method may be desirable if memory is at a premium.

Figure 3:
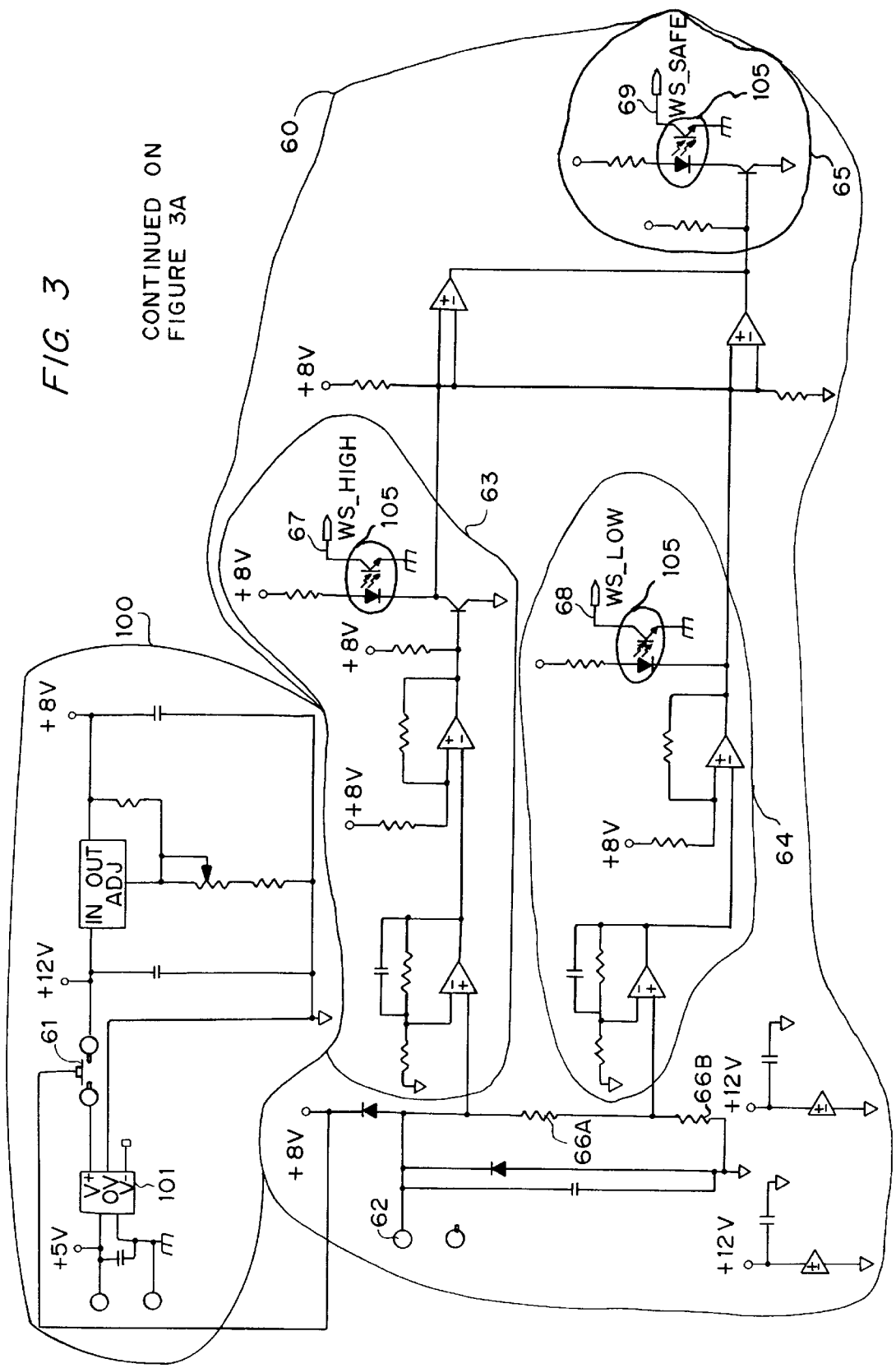
FIG. 3 is a schematic diagram of a testing and logic circuit of the automated test unit of FIG. 1.
Figure 3A:
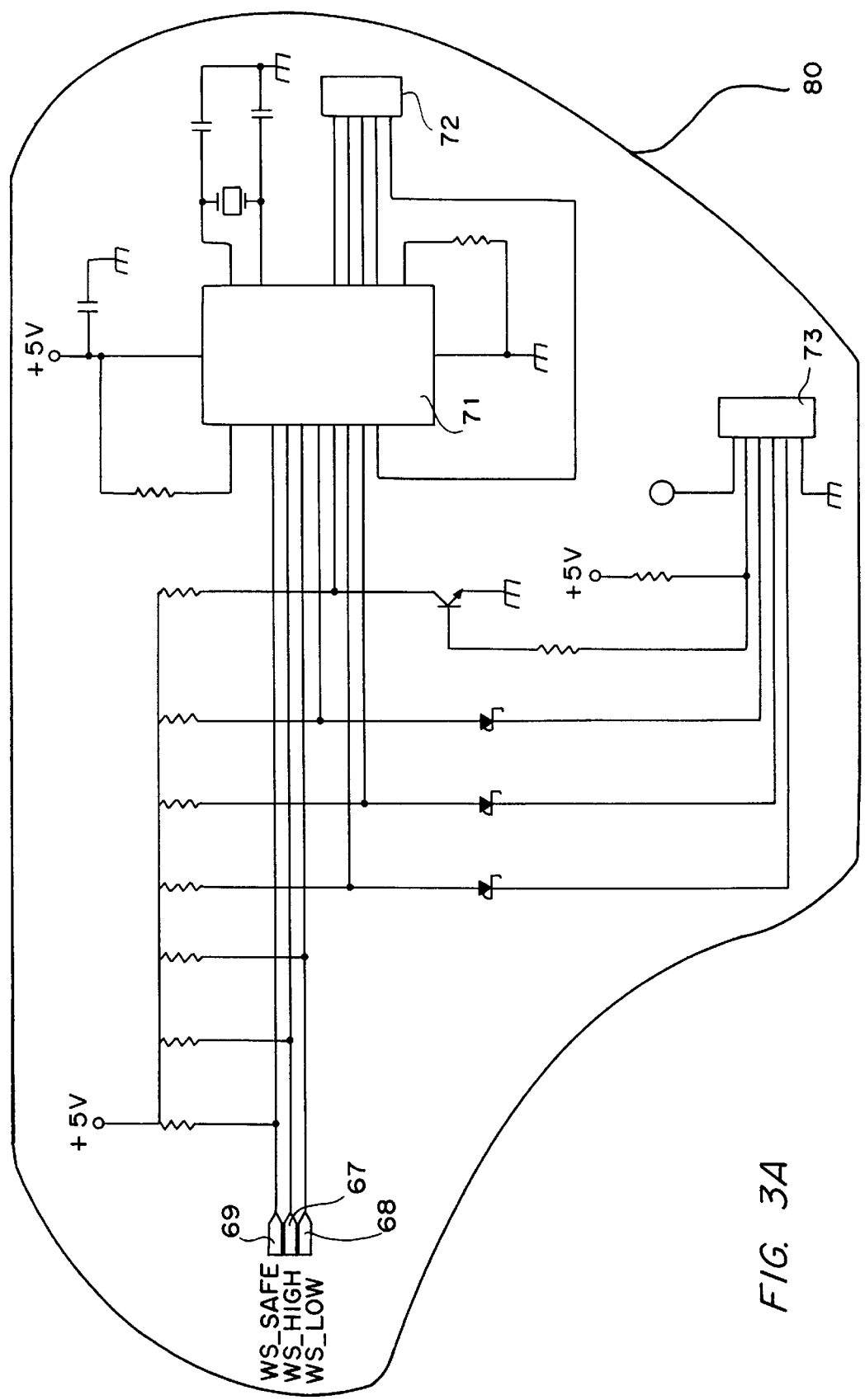

The time clock also is modified to include additional circuits and hardware for performing the ESD device verification. FIG. 3 shows logic circuit 24 which is integrated into a conventional time clock. Circuit 24 comprises closed-loop resistive testing circuit 60, data interface circuit 80 and isolated power supply 100. Testing circuit 60 may be any closed-loop resistive testing circuit known to one of skill in the art. Similarly, systems 10 according to the present invention may employ capacitative or other testing circuits as desired; the invention should not be interpreted as limited to resistive testing circuits. Fifteen pin connector 33 may also be provided which allows other input devices to be connected to test unit 18. For instance, customized card reader interfaces may be connected to test unit 18 as well as proximity readers, bar-code readers or other devices as may be appropriate.

In the illustrated embodiment using resistive measuring techniques, circuit 60 comprises push-button 61 (shown as part of power supply 100), banana jack input 62, high resistance comparator 63, low resistance comparator 64 and safe level logic 65. Circuit 60 functions by comparing the resistance in a loop created by joining push-button 61 and input 62 to reference resistors 66A and B. The loop is formed through the worker's body when the worker connects his or her wrist strap to input 62 and presses button 61. When button 61 is depressed, a voltage also is applied to reference resistors 66A and B. Multiple reference resistors may be provided so that the worker or employer may select from several different test levels.

The resistance of the operator is compared to the resistance of reference resistor 66A and B by high resistance comparator 63. The resistance of the operator plus the resistance of resistor 66A is compared to the resistance of resistor 66B by low resistance comparator 64. If the resistance of the operator exceeds a predetermined level or threshold, this result is detected by comparator 63 and a "high" signal is delivered to circuit 80 via line 67. Likewise, if the resistance of the operator is too low, this result is detected by comparator 64 and a "low" signal is delivered to circuit 80 via line 68. If the resistance of the operator is in an acceptable range, logic 65 delivers a "safe" signal to circuit 80 via line 69.

Each of the signals is passed through an optical isolator 105 prior to being transmitted to circuit 80. Optical isolators 105 eliminate any direct electrical connection between circuits 60 and 80, thus preventing any inadvertent ground loops which could cause erroneous readings. Additional isolation of circuit 24 is provided through circuit 100 which provided an isolated DC/DC converter 101 which isolated the power circuit from earth ground.

Logic circuit 80 converts, via logic device 71, the signals received from comparator logic circuits 63–65 into a format which is recognized by the time clock. In the illustrative embodiment, logic device 71 delivers the formatted data to keypad interface 72 which is connected to the keypad input interface of a conventional time clock. The time clock may be programmed to store the test data appropriately. An additional interface 73 also is provided for accepting test signals from optional device 20.

Optional device 20 may be an ESD device testing unit for verification of other types of ESD devices such as heel straps or other garments. In the illustrative embodiment, as shown in FIG. 2, optional device 20 is a footwear tester comprising handle unit 22 and grounded foot plate 21. In order to test footwear, the worker steps on plate 21 and grasps hand bar 22, thereby forming a loop. When hand bar 22 is grasped, the worker's hand breaks an infrared beam which triggers circuit 94 and energizes the circuit 90. Other triggering mechanisms, such as mechanical switches, may also be used. Other types of footwear testers may be used. For instance, two separate footplates may be used to allow testing of each foot independently. Also, if the floor of the facility is grounded, a footplate may not be necessary.

In order to perform a test and record the test data, an employee approaches test station 17, shown in FIG. 2. The employee inserts a connector from his or her ESD device into port 28. This connects the ESD device to testing circuits 24. The employee then swipes ID card 30, which bears the employee's identification number in some form, through slot 32 of unit 18.

Automated test unit 18 reads all bar code formats supported by the logic circuit provided by the time clock, which, in the illustrated embodiment, is a HBCR-1611 decoder IC. The characters are read from the bar code, magnetic stripe, proximity reader, or other data storage formats, any of which may be selected as appropriate. Automated test unit 18 parses characters from employee identification card 30. The user may program automated test unit 18 with the start parse position and ID length (number of characters) via the RS485 interface through the control software described below. Automated test unit 18 stores these values in non-volatile memory. The user is also able to query, via computer 12, automated test unit 18 via the RS485 interface to determine the current values of the start parse position and ID length.

If the card is not read properly a "VOID" message will appear in LCD readout 34. The worker may then slide the card through the slot again. Once his or her identification is verified (by readout 34), he or she presses button 36, which initiates the test and indicates the results on screen 34. If the test is successful, the employee unplugs his or her device and proceeds to the appropriate workstation. If the test is unsuccesful, the worker then performs appropriate corrective action, such as tightening the strap, applying conductive lotion or replacing the wrist strap, or other action as may be required in the particular workplace or applicable standards or procedures. The worker then repeats the testing process.

One of the following messages may appear on LCD readout 34, when performing a wrist strap test:

| | MESSAGE | RESISTANCE RANGE |
|---|---|---|
| A. | PASS/SAFE | 935 kilo$\Omega$ ± 5% TO 10 MEG$\Omega$ ± 5% |
| B. | FAIL/HI | RESISTANCE TOO HIGH |
| C. | FAIL/LO | RESISTANCE TOO LOW |

Other messages may displayed as appropriate.

Testing results are stored in automated test unit 18 and are periodically automatically transferred to computer 12 when automated test unit 18 is polled. The data may be stored by computer 12 as a data string such as:

| 0000 | 960411 | 11216 | 10100014 | 33 |
| Test Unit No. | Date | Time | ID Card No. | Test Result* |

Computer 12 may determine from which test unit 18 particular data is retrieved. Thus, test unit 18 need not devote any memory to the "Test Unit No." as shown above. The data stored by test unit 18 may simply begin with the date. When computer 12 polls a particular test unit 18, it appends the "Test Unit No." of the unit 18 being polled to the data that is retrieved. Where test results are represented as follows:

11=PASS//SAFE

22=FAIL/HI

33=FAIL/LO

Other data formats may be used as desired.

To test the integrity of properly worn footwear the worker steps onto grounded stainless steel plate 21 which forms part of the footwear tester. Other footwear tester may also be used. for instance, if the floor is grounded, a steel plate is not required. If independent testing of each foot is desired, multiple plates may be provided or the worker may be required to test one foot at a time. Other footwear testing methods and apparatuses will be apparent to those skilled in the art. The worker then slides his or her card through slot 32 of automated test unit 18. If the card is not read properly, a "VOID" message will appear on LCD readout 34. The worker may then repeat sliding the card through slot 32.

The worker firmly grasps the stainless steel contact bar on the front of the grip 22, when prompted by LCD readout 34. The worker maintains a grip on the bar until the test results appear in LCD readout 34. One of the following messages may appear on the LCD readout:

| Message | EN652 Indication | Definition |
| --- | --- | --- |
| Pass/Safe | Green LED | Resistance between pre-set limits |
| Fail/Hi | Yellow LED | Resistance above pre-set limits |
| Fail/Lo | Red LED | Resistance below pre-set limits |

The test results are periodically automatically transferred to computer 12 when automated test unit 18 is polled. The data may be stored on computer 12 as a data string consisting as follows:

| 0000 | 960411 | 11216 | 10100014 | 41 |
| Test Unit No. | Date | Time | ID Card No. | Test Result* |

Computer 12 may determine from which test unit 18 particular data is retrieved. Thus, test unit 18 need not devote any memory to the "Test Unit No." as shown above. The data stored by test unit 18 may simply begin with the date. When computer 12 polls a particular test unit 18, it appends the "Test Unit No." of the unit 18 being polled to the data that is retrieved. Where test results are represented as follows:

41=Pass/Safe

42=Fail/Hi Resist

43=Fail/Lo Resist

Automated test unit 18 can include a relay or other desired circuit which may be used to control worker access to work areas. For example, a worker may be required to verify his or her ESD devices before entering a clean room. The door to the clean room is controlled by the relay. The relay in automated test unit 18 activates only when there is "PASS/SAFE" status from the wrist strap test unit 22 and/or footwear test unit 20. The user may, via computer 12, program the "on time" of the relay, in seconds, via the RS485 interface, for instance, to give the worker enough time to move from automated test unit 18 to the door. Automated test unit 18 stores this value in non-volatile memory. Thus, the door cannot be opened until a test has been performed and passed.

Figure 4:
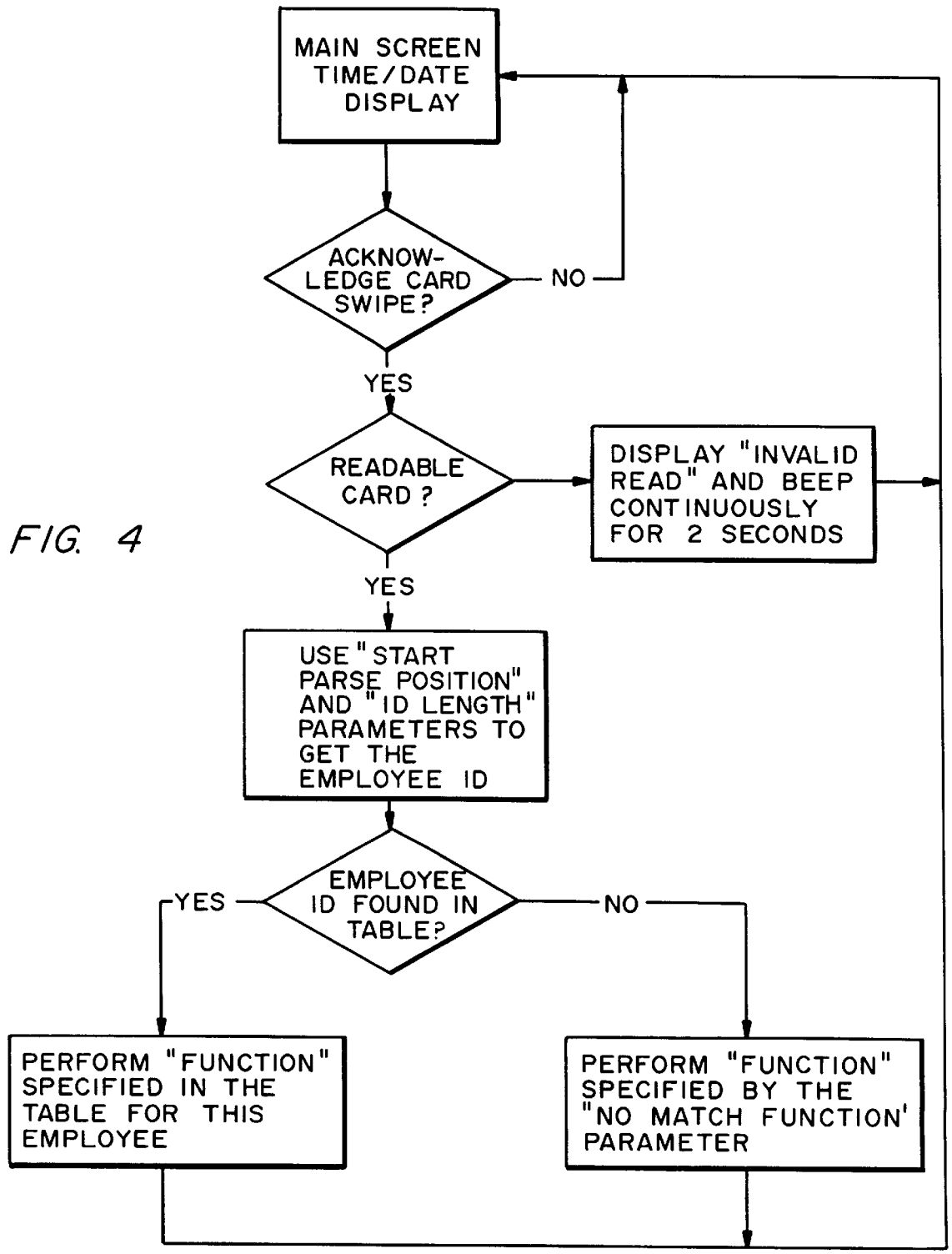
FIG. 4 illustrates the main logic flow for the control software of the automated test unit of FIG. 2.

FIG. 4 illustrates the logic flow followed by automated test unit 18 when ID card 30 is swiped through slot 32. Once card 30 is swiped through the reader, automated test unit 18 looks up the employee ID in the employee database or table to determine which function must be preformed. Seven functions, as listed below, may be provided.

| Function | Function Value |
| --- | --- |
| "Access Denied-Log" | 3 |
| "Access Denied-Ignore" | 12 |
| "No Test Required" | 36 |
| "Wrist Strap Only" | 48 |
| "Footwear Only" | 66 |
| "Wrist Strap AND Footwear" | 129 |
| "Wrist Strap OR Footwear" | 192 |

Additionally, the user may program automated test unit, via computer 12, with a "No Match Function." This parameter specifies which of the 7 functions listed above automated test unit 18 will perform when an employee's ID does not match any in the table. For instance, a default value may be Function 192—"Wrist Strap OR Footwear."

Figure 5:
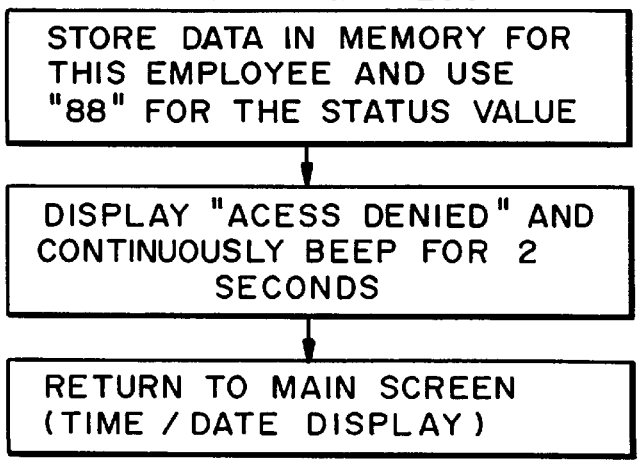
FIG. 5 illustrates the "Access Denied-Log" logic flow for the control software of the automated test unit of FIG. 2.
Figure 6:
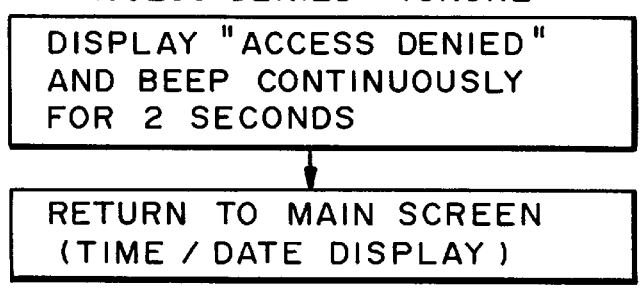
FIG. 6 illustrates the "Access Denied-Ignore" logic flow for the control software of the automated test unit of FIG. 2.

FIG. 5 illustrates the logic flow for the "Access Denied-Log" function. In this function mode, the employee data retrieved from ID card 30 is recorded in memory. However, access to the testing functions and work areas is denied. FIG. 6 illustrates the logic flow for the "Access Denied-Ignore" function. In this function mode, no data is recorded and access to testing functions and work areas is denied. These functions are provided to exclude unauthorized personnel from work areas. The Access Denied-Log function may be provided to record attempts at unauthorized entry.

Figure 7:
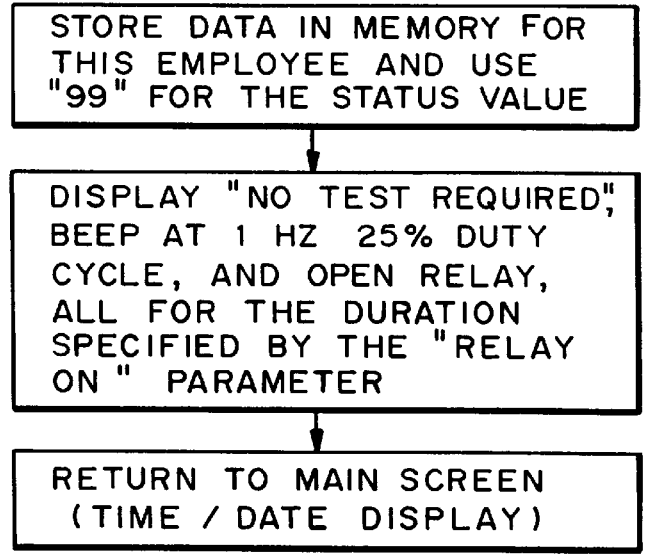
FIG. 7 illustrates the "No Test Required" logic flow for the control software of the automated test unit of FIG. 2.

FIG. 7 illustrates the logic flow for the "No Test Required" function. In this mode, data from the ID card 30 is recorded in memory, however, a message reading "no test required" is displayed on the screen. This function may be provided to allow individuals who are not required to use ESD devices (such as supervisors) to enter a work area.

Figure 8:
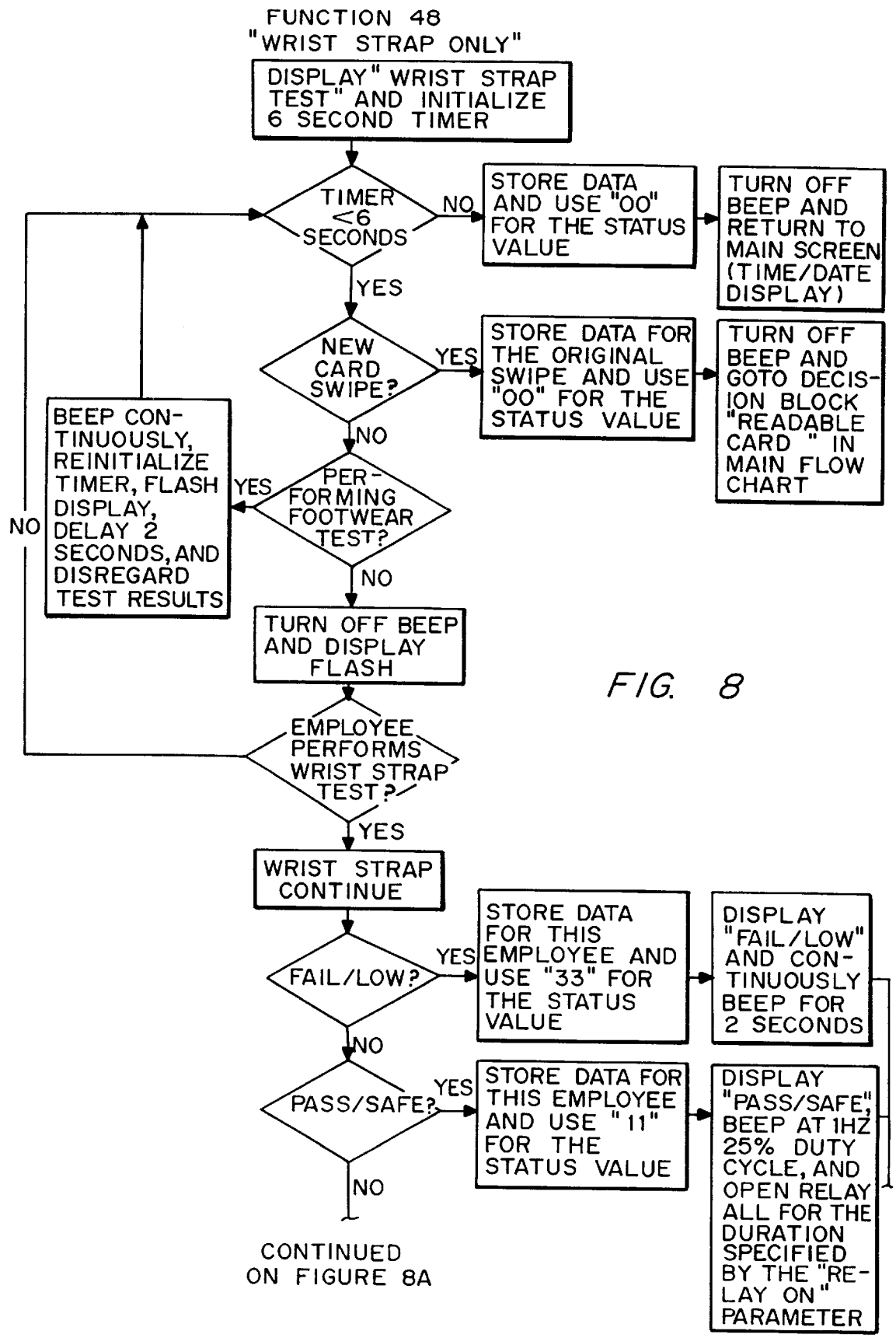
FIG. 8 illustrates the "Wrist Strap Only" logic flow for the control software of the automated test unit of FIG. 2.
Figure 8A:
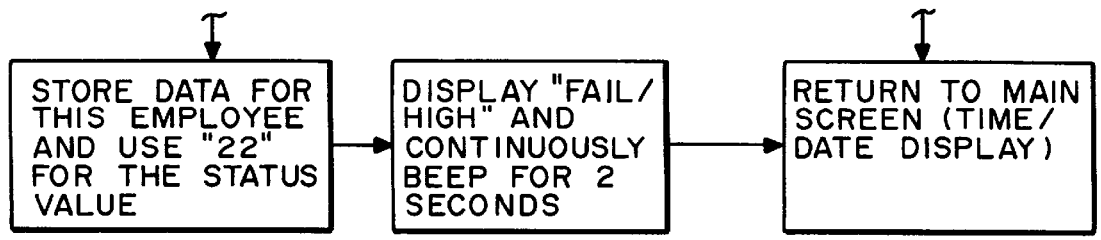

FIG. 8 illustrates the logic flow of the "Wrist Strap Only" function. In this functional mode, the employee's ID information is recorded following a card swipe. When the employee initiates the test of the wrist strap, automated test unit 18 performs the test and records whether or not the test was passed. If the test was passed automated test unit 18 displays a "Pass/Safe," beeps and opens the relay. If the test is failed, the appropriate display appears (either "Fail/High" or "Fail/Low") and the employee must take appropriate corrective action.

Figure 9:
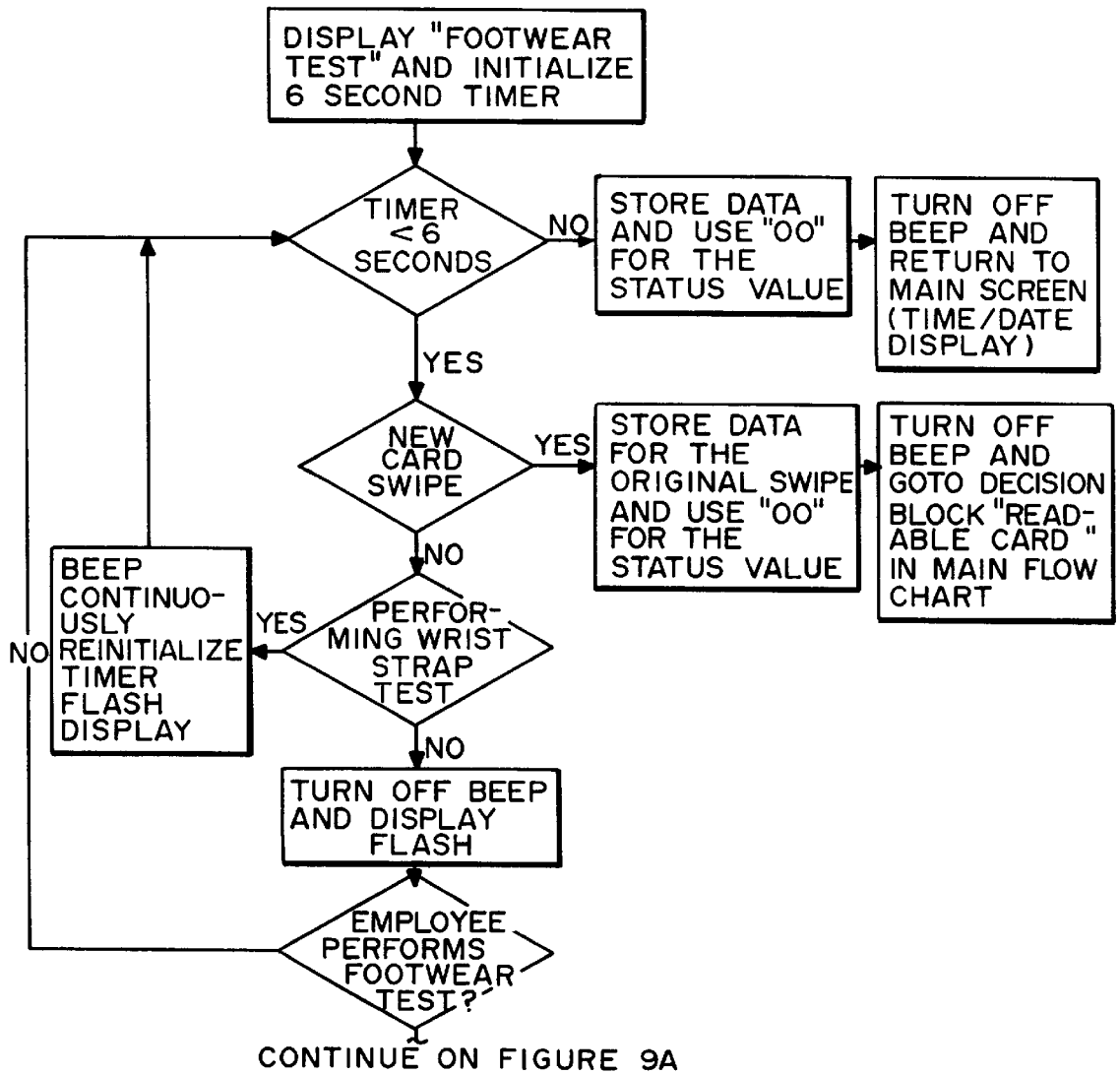
FIG. 9 illustrates the "Footwear Only" logic flow for the control software of the automated test unit of FIG. 2.
Figure 9A:
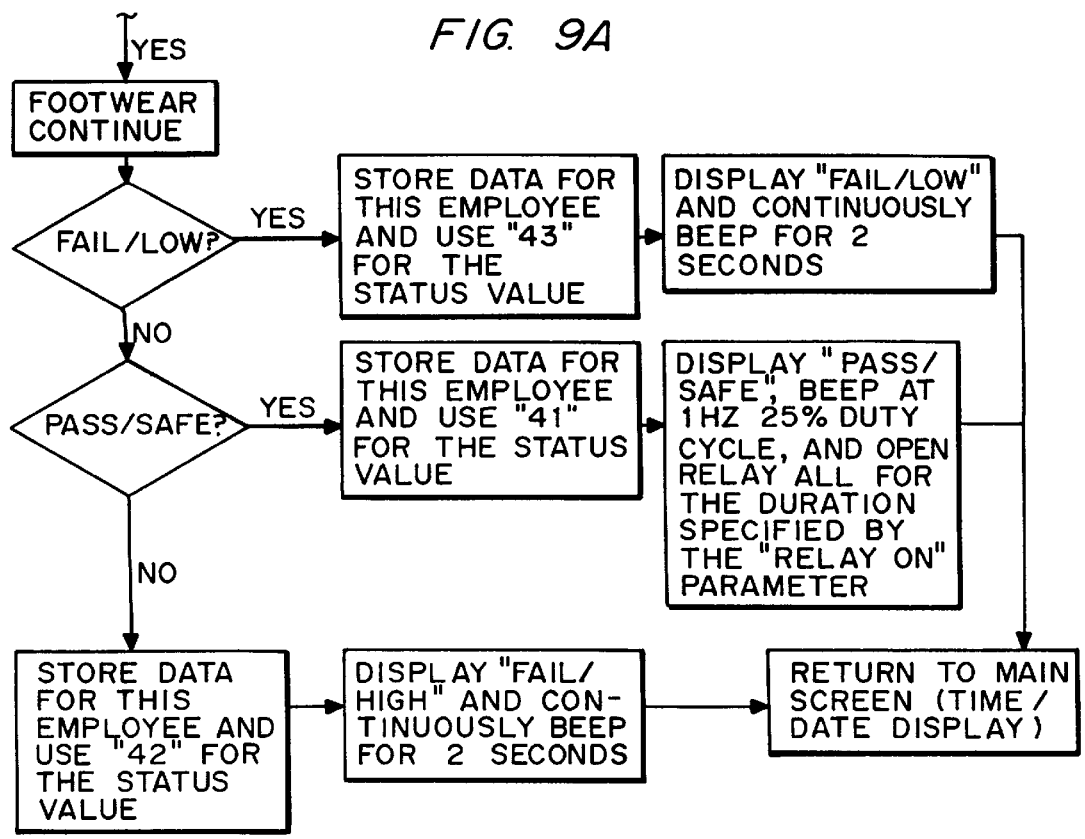

FIG. 9 illustrates the logic flow for the "Footwear Only" function. This logic flow is essentially the same as that shown in FIG. 9 and described above with the exception that it is directed to testing of footwear ESD devices.

Figure 10:
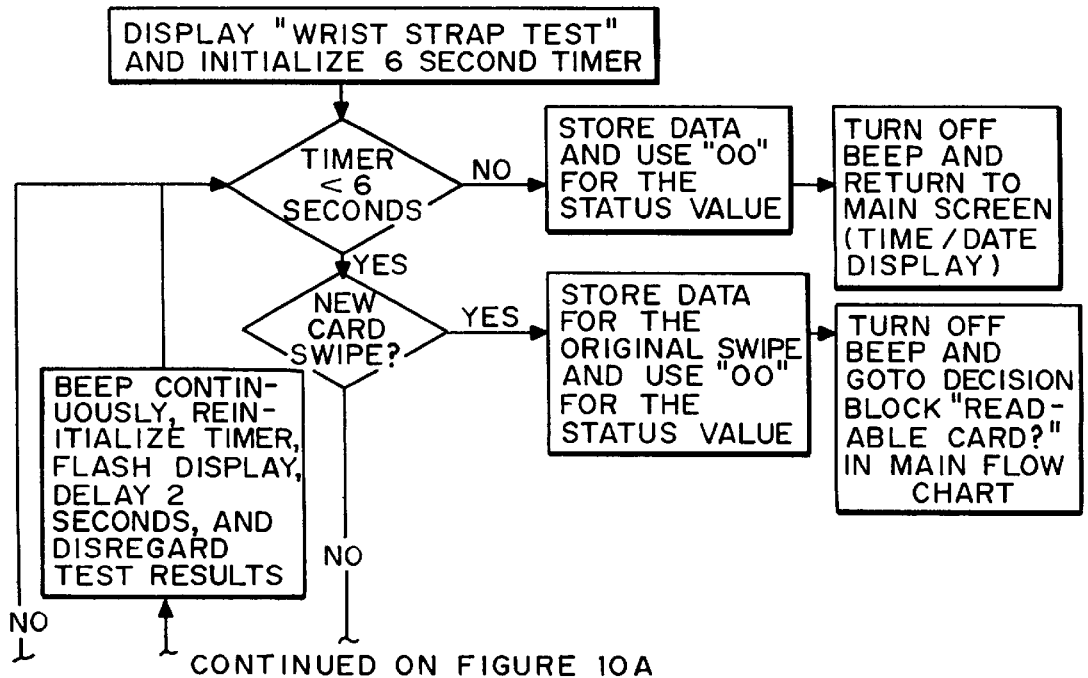
FIG. 10 illustrates a first portion of the "Wrist Strap and Footwear" logic flow for the control software of the automated test unit of FIG. 2.
Figure 10A:
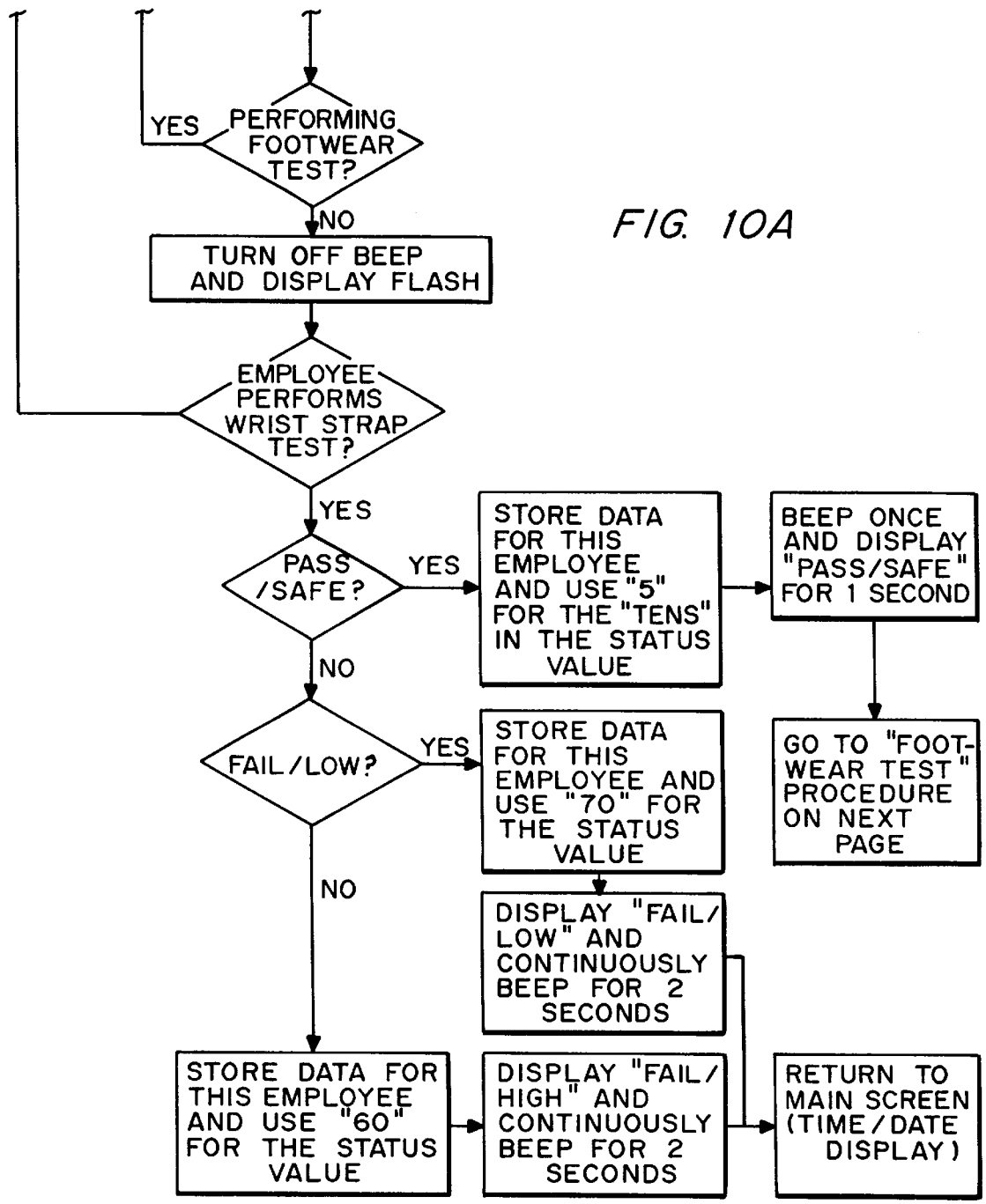
FIG. 10A illustrates a second portion of the "Wrist Strap and Footwear" logic flow for the control software of the automated test unit of FIG. 2.
Figure 10B:
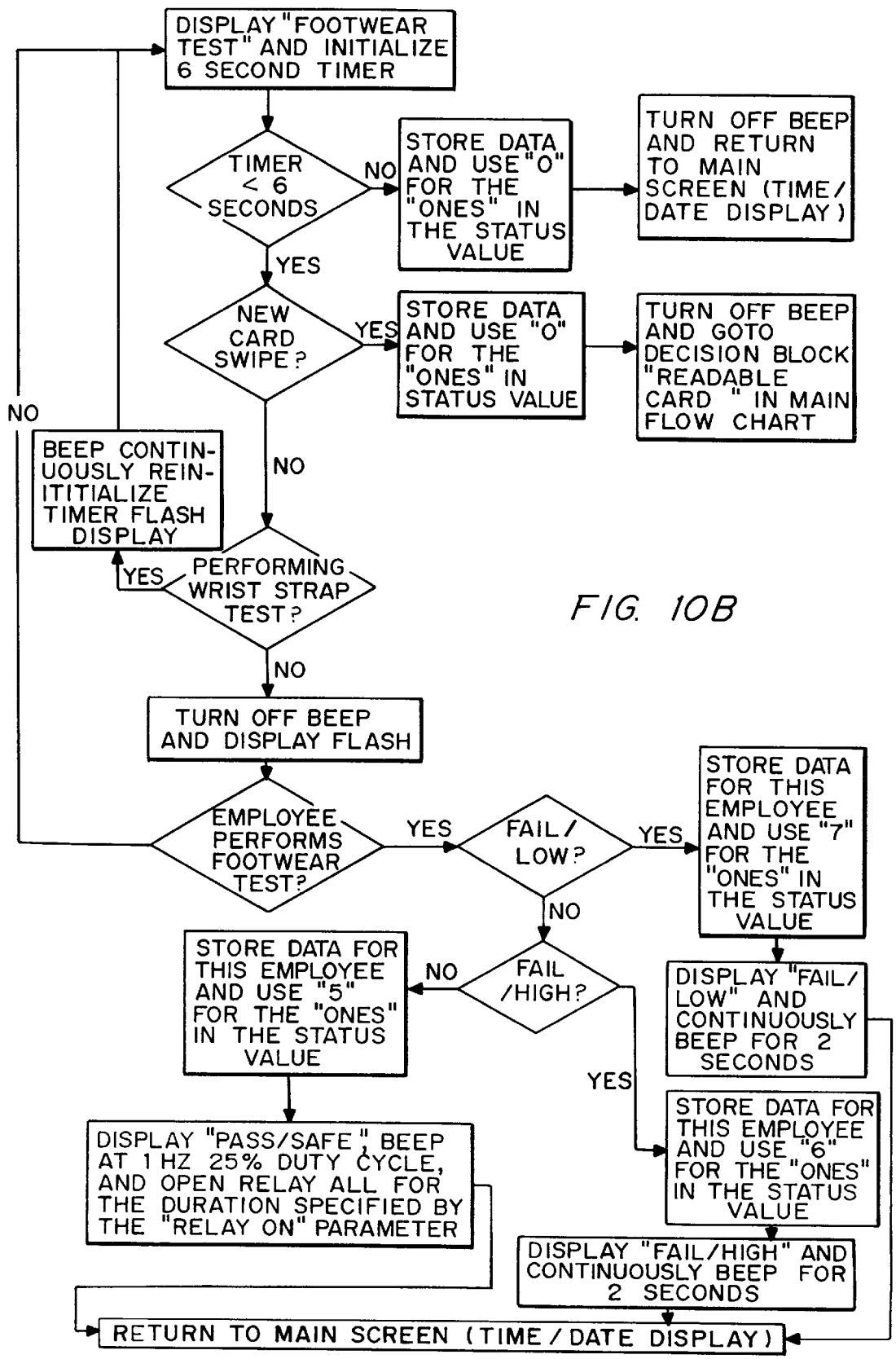

FIGS. 10 and 110A illustrate the logic flow of the "Wrist Strap and Footwear" function. In this function both the wrist strap and footwear ESD devices are tested. The same logic flow would be applicable to any other testing of multiple ESD devices being used by one employee. This functional flow essentially combines the logic flows described in FIGS. 8 and 9 such that when the wrist strap test is performed, a passed test does not open the relay and allow the employee to proceed, but rather prompts a test of the second ESD device, such as the footwear. Of course, the test may be performed in any desired sequence and for any types of ESD devices.

Figure 11:
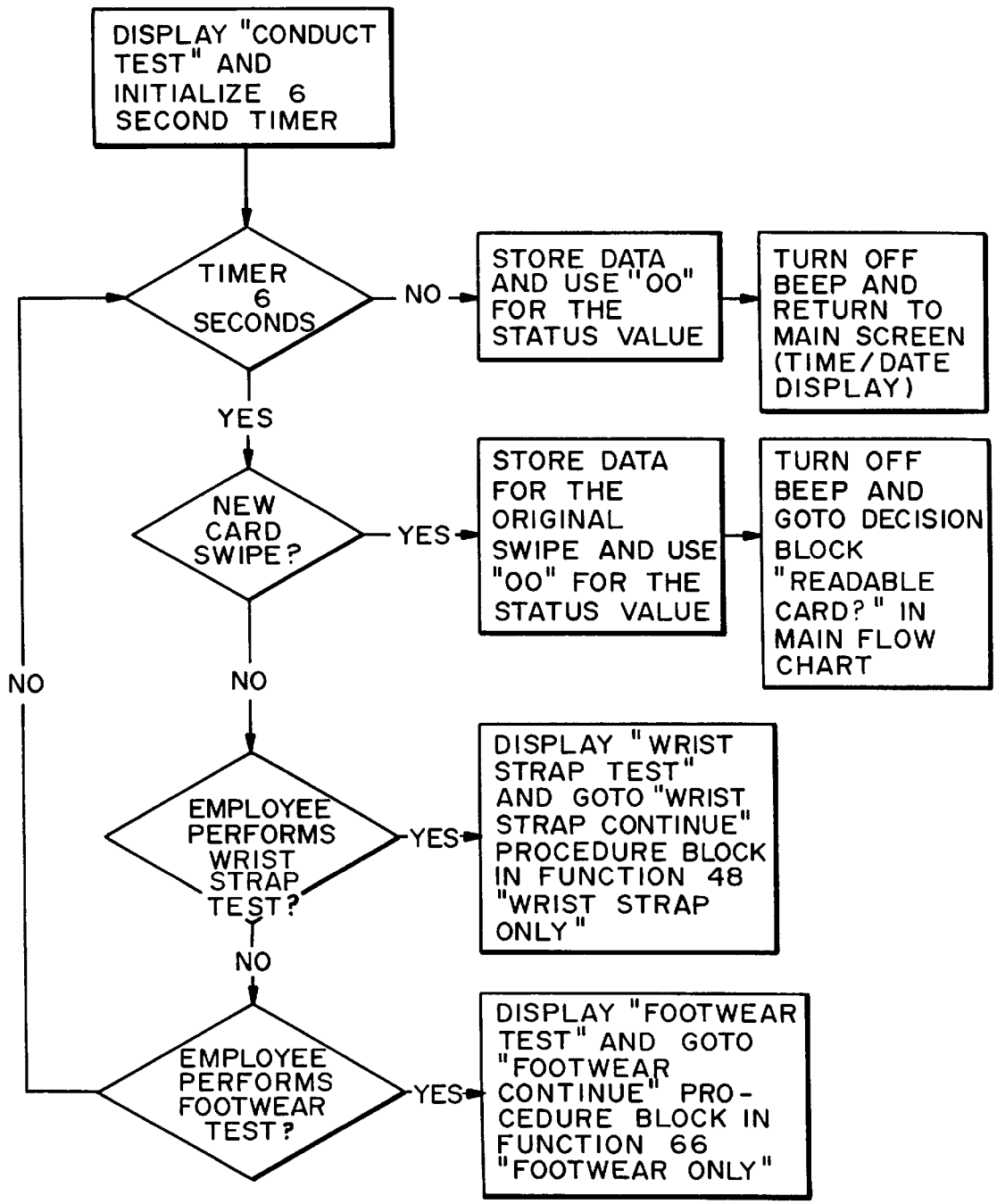
FIG. 11 illustrates the "Wrist Strap or Footwear" logic flow for the control software of the automated test unit of FIG. 2.

FIG. 11 illustrates the logic flow for the "Wrist Strap or Footwear" test function. This functional mode allows an employee to choose between footwear or wrist strap testing. Once the test is selected the functional mode transfers to either the wrist strap only functional flow or the footwear only functional flows described above.

Software for use on a personal computer (PC) may be provided which may be used to periodically poll automated test units 18. The polling function captures data from automated test units 18 for later use. The software also allows automated test units 18 to be programmed from a central location. The interface for the software may be menu-, "DOS"-, or "Windows"-based. Other operating systems and user interfaces may be used as desired. Alternatively, test data may be stored by test unit 18 on a floppy disk, hard drive or other form of permanent storage device. The user may then periodically collect disks or data from each storage device for record keeping or other purposes.

Figure 15:
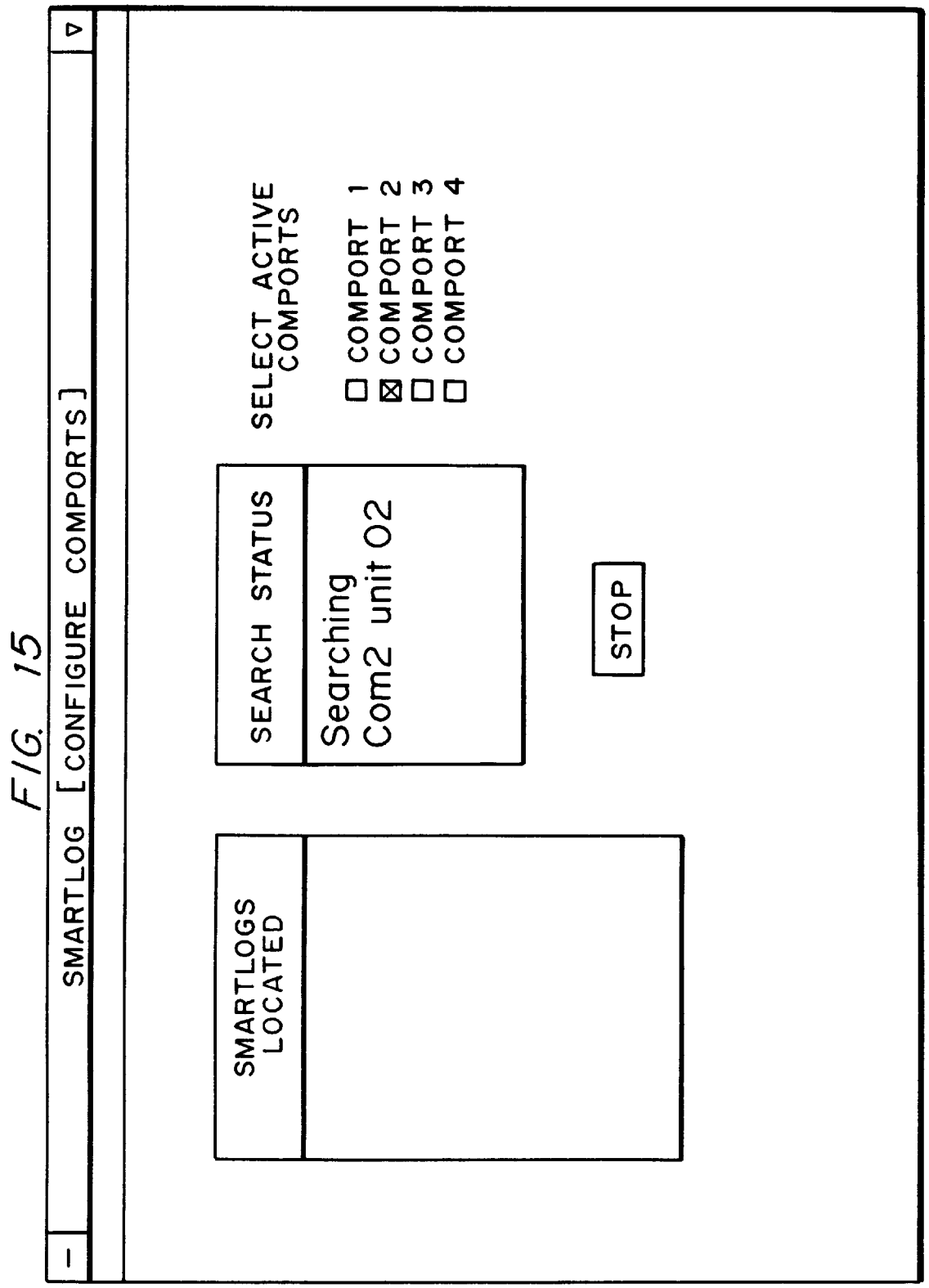
FIG. 15 shows a user interface screen for setting the communication ports of a monitoring system in accordance with the present invention.

In a DOS based system a menu (not shown) may display line information used to configure the software so that computer 12 may communicate and receive data from automated test units 18. This screen may include conventional communications configuration elements, such as identification and assignment of communications ports of computer 12 to be used for communication with automated test units 18. The same functionality may be provided in a Windows-based system as illustrated in FIG. 15.

Another menu (not shown) may display and allow manipulation of information regarding automated test units 18, such as unit number. Unit number may be, for instance, a two digit field specifying automated test unit 18 address. All automated test units 18 in communication with computer 12 are defined to be accessed during the polling operation. For example, the first automated test unit number may be set to 00 and additional units may be numbered sequentially. Also, as shown in FIGS. 12 and 13, the test units may be programmed, either globally (FIG. 13) or individually (FIG. 12), to read the employees identification data in a given format. For instance, as illustrated in FIG. 12, a test unit may be programmed to read the identification number from the first digit of the data received from the identification source (such as a magnetic card, bar-coded card or proximity-read card) and read the eight digits that follow. Each unit may also be programmed to turn the relay on for a given period of time. For example, in FIG. 12, the time is set for five seconds.

Another menu may allow the user to synchronize all automated test units 18 for date/time. When that function is selected, the software will prompt the user as necessary.

Yet another menu allows the user to begin the data acquisition of testing results:

a. Continuous Polling may be selected.
b. The Continuous Poll Interval may be set. For instance, the default may be a 30 minute interval. The user may accept the default or enter a new interval.
c. Continuous polling is initiated. As illustrated in FIG. 14, the polling rate may also be as desired with intervals ranging from minutes to hours. A polling status log may be provided which allows the user to view polling status of automated test units 18.

As illustrated in FIGS. 16–20, employee databases, i.e., databases of the employees names, identification number, test requirements and other relevant data, may be created and saved, edited or imported into the system and downloaded to one or more test units 18. As shown in FIG. 16, employee data, such as names, ID number, title and test requirements may be input into a data file. This data file may be supplemented with data from imported files (FIG. 17). The user may append, update or replace existing files with imported files. The user may also open and edit existing files (FIG. 18) and save edited files as new data files (FIG. 19). These databases may be downloaded to test units 18 as necessary (FIG. 20).

As shown in FIGS. 21–24, the software allows retrieval and review of test results. If a printer is attached to the computer, a print out of the transactions may be obtained.

The test result data are stored on the PC hard drive as automated test unit 18 is polled by the PC software. The data may reside in the same directory as the polling program. The strings maybe stored in ASCII format.

The file may be easily imported into a spreadsheet or data base program for sorting by fields . An example of the data file format is shown below.

| Unit # | Date | Time | Operator ID | Test Result |
|---|---|---|---|---|
| 0 | 960610 | 1622 | 10100002 | 22 |
| 0 | 960610 | 1622 | 10100002 | 22 |
| 0 | 960610 | 1622 | 10100002 | 33 |
| 0 | 960610 | 1629 | 10100002 | 33 |
| 0 | 960610 | 1631 | 10100008 | 33 |
| 0 | 960610 | 1631 | 10100008 | 33 |
| 0 | 960610 | 1631 | 10100008 | 33 |
| 0 | 960610 | 1631 | 10100008 | 33 |
| 0 | 960610 | 1631 | 10100008 | 33 |
| 0 | 960610 | 1632 | 10100008 | 33 |
| 0 | 960610 | 1632 | 10100008 | 33 |

Other formats or databases may be used as appropriate. For example, the data may be provided in a format which is compatible with commercially available database applications such as Microsoft Access™.

Figure 21:
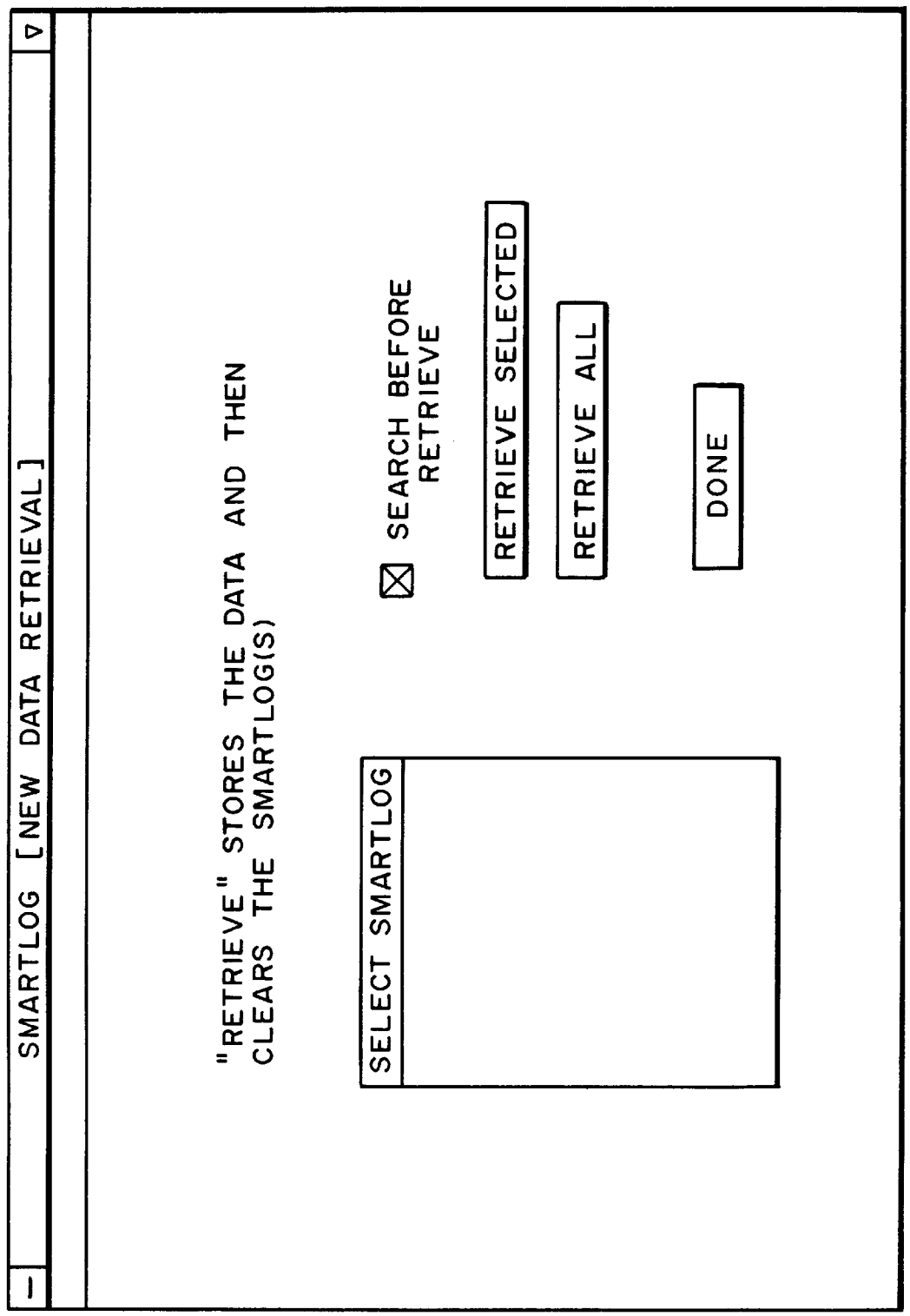
FIG. 21 shows a user interface screen for retrieving data from a test unit with a monitoring system in accordance with the present invention.

Each time automated test units 18 are polled, the data is downloaded to computer 12 and erased from automated test unit 18 memory (FIG. 21). Test results are stored in a database which may periodically be compiled into an archive (FIG. 23). For example, automated test units 18 may be polled once every twenty-four hours. Thus, a database is created for each day. At the end of each week, each of these databases may be compiled into an archive for that week. The archive data may then be manipulated as required to meet reporting requirements. The duration of each of the time intervals, i.e., polling period and archiving period, may be programmed by the use.

Moreover, the user may periodically access test data by viewing (FIGS. 22 and 25) or copying (FIG. 24) without erasing automated test unit 18 memory or creating an archive. The user may select a "copy" function, by which all automated test units 18 are polled and all stored data may be copied into a temporary file which allows the user to view the most recent data without interrupting the usual data collection procedures. This allows a supervisor to instantaneously view test results.

Although the foregoing is provided for purposes of illustrating, explaining and describing two of such systems in particular detail, modifications and adaptations to the described systems and other embodiments will be apparent to those skilled in the art and may be made without departing from the scope or spirit of the invention.

What is claimed is:

1. A method for automatically auditing the efficacy of electrostatic discharge (ESD) devices worn by an operator comprising the steps of:
   a) identifying the operator;
   b) selecting a test protocol specific to the identified operator;
   c) testing the ESD device using the selected test protocol with at least one of a plurality of testing units;
   d) temporarily storing the results of the test; and
   e) periodically downloading the stored test results to a central computer database.

2. The method of claim 1 in which the step of storing the test results is performed by the testing unit.

3. The method of claim 2 further comprising the step of visually displaying the downloaded test results.

4. The method of claim 3 in which the step of periodically downloading the stored test results is performed with sufficient frequency so as to provide a virtually real-time visual display of the status of the ESD devices.

5. The method of claim 1 further comprising the step of periodically archiving the downloaded test results.

6. The method of claim 5 further comprising the step of periodically formatting the archived test results in a manner prescribed by a ESD auditing program reporting standard.

7. The method of claim 6 in which the step of formatting the archived test results is performed in accordance with an industry standard.

8. The method of claim 1 further comprising the step of controlling access to a work area in accordance with the test results.

9. A system for auditing the efficacy of electrostatic discharge (ESD) devices comprising:
   a) at least one ESD device testing unit having at least one logic circuit for evaluating the efficacy an ESD device, worker identification circuitry; a clock and a memory;
   b) a computer in communication with the testing unit;
   c) a software program resident on the computer for programming the testing unit and periodically downloading and formatting test data from the testing unit; and
   d) a software program resident in the memory for relating a worker specific test protocol to a worker identified by the worker identification circuitry.

10. The system of claim 9 in which the testing unit further comprises at least one circuit for testing resistance.

11. The system of claim 9 in which the clock is a conventional time clock.

12. The system of claim 9 further comprising a circuit and interface for downloading data from the testing unit to the computer.

13. The system of claim 9 further comprising a circuit for downloading test criteria based on worker identity, performing tests according to the criteria, and storing and processing results of the tests.

14. The system of claim 9 further comprising a circuit, responsive to the logic circuit, for controlling access to a work area.

15. A unit for testing the efficacy of electrostatic discharge (ESD) devices comprising:
   a) a clock;
   b) an employee database;
   c) a sensor for identifying an employee in communication with the employee database;
   d) a function database in communication with the employee database;
   e) at least one resistive loop logic circuit;
   f) a test results database in communication with the clock, the logic circuit and the sensor; and
   g) software in communication with the sensor and employee database for selecting a worker specific test protocol from the function database.

16. The unit of claim 15 in which the sensor is a magnetic stripe reader.

17. The unit of claim 15 in which the sensor is a numeric pad.

18. The unit of claim 15 in which the sensor is a proximity device.

19. The unit of claim 15 in which the sensor is a bar code reader.

* * * * *